United States Patent [19]
Kim et al.

[11] Patent Number: 5,543,254
[45] Date of Patent: Aug. 6, 1996

[54] PHASE SHIFT MASK AND METHOD FOR FABRICATING THE SAME

[75] Inventors: Young S. Kim; Young M. Ham, both of Kyoungki-do, Rep. of Korea

[73] Assignee: Hyundai Electronics Industries Co., Ltd., Rep. of Korea

[21] Appl. No.: 375,523

[22] Filed: Jan. 19, 1995

[30] Foreign Application Priority Data

Jan. 19, 1994 [KR] Rep. of Korea ................... 94-967

[51] Int. Cl.⁶ .......................................... G03F 9/00
[52] U.S. Cl. ..................... 430/5; 430/313; 430/314; 430/323; 430/324
[58] Field of Search ................... 430/5, 311, 313, 430/314, 322, 323, 394

[56] References Cited

U.S. PATENT DOCUMENTS

| | | |
|---|---|---|
| 5,130,263 | 7/1992 | Possin et al. . |
| 5,276,551 | 1/1994 | Nakagawa ................... 430/5 |
| 5,380,609 | 1/1995 | Fujita et al. . |
| 5,409,789 | 4/1995 | Ito . |
| 5,418,092 | 5/1995 | Okamoto ................... 430/5 |

*Primary Examiner*—S. Rosasco
*Attorney, Agent, or Firm*—Merchant, Gould, Smith, Edell, Welter & Schmidt

[57] ABSTRACT

A phase shift mask and a method for fabrication of a phase shift mask provided with a groove formed by etching to a predetermined depth a portion of a transparent substrate on which an edge portion of a phase shift film pattern directly coated on the transparent substrate is disposed, thereby capable of preventing the phenomenon of an undesirable photoresist film residue being left upon a silicon substrate using a Levenson-type phase shift mask.

4 Claims, 3 Drawing Sheets

PHASE SHIFT MASK AND METHOD FOR FABRICATING THE SAME

BACKGROUND OF THE INVENTION

1. Field of the Invention

The present invention relates to a phase shift mask and a method for fabricating the same, and more particularly to a phase shift mask of the Levenson type provided with a groove formed by etching to a predetermined depth a portion of a transparent substrate on which an edge portion of a phase shift film pattern is disposed, thereby capable of preventing a phenomenon of an undesirable photoresist film residue being left on a silicon substrate. The present invention also relates to a method for fabricating such a phase shift mask.

2. Description of the Prior Art

In conventional methods for the formation of a photoresist film, a photo mask of the type including a photo shield film pattern, for example, a chromium pattern formed on a quartz substrate, has been mainly used as a mask for a lithographic process. Where such a photo mask is used to perform an exposure process in the fabrication of a highly integrated semiconductor device, severe light diffraction and interference phenomenons occur at the boundaries of the photoshield film patterns of the photo mask. This is because light beams penetrating adjacent photoshield patterns of the mask have the same phase. As a result, no definition of photoresist patterns is generated, thereby degrading the resolution of the photoresist patterns.

In order to define patterns having a critical dimension, a phase shift mask has been proposed, which includes a phase shift pattern in addition to the photo-shield pattern.

In such a phase shift mask, when an incident light penetrates a phase shift layer between adjacent photo shield film patterns, the phase angle of the incident light is shifted through an angle of 180° so that the light emerging from the phase shift layer between adjacent photo shield film patterns has a reverse phase. As a result, the light diffraction and interference phenomenons which occur at the boundaries of the photo shield film patterns are minimized. Accordingly, it is possible to obtain an improved resolution of photoresist film patterns.

An example of a conventional phase shift mask of the Levenson-type will now be described in conjunction with FIGS. 1A and 1B.

FIG. 1A is a plan view of the conventional Levenson type phase shift mask. As shown in FIG. 1A, the phase shift mask includes a transparent substrate 10 and a plurality of uniformly spaced photoshield film patterns 1 formed on the transparent substrate 10. The photoshield film patterns 1 are classified into groups comprising a pair of photo shield film patterns 1. The phase shift mask also includes a phase shift film pattern 2 formed on the transparent substrate 10 such that it overlaps with the patterns of each photo photoshield film pattern group.

FIG. 1B is a plan view of positive photoresist film patterns 5 formed on a wafer 20 by use of the phase shift mask shown in FIG. 1A. The photoresist film patterns 5 exhibit a high resolution by virtue of the effect of the phase of light penetrating each phase shift film pattern 2 of the phase shift mask being shifted through an angle of 180°. However, a residue 3 of the photoresist film is left at the edge portions of each phase shift film pattern 2 directly coated on the transparent substrate 10 because light involving an 180° phase shift meets light not involving a 180° phase shift at the edge portions. The residue 3 results in undesirable residues of patterns formed at subsequent steps. As a result, a poor product is formed.

SUMMARY OF THE INVENTION

Therefore, an object of the present invention is to provide a phase shift mask provided with a groove formed by etching to a predetermined depth a portion of a transparent substrate on which an edge portion of a phase shift film pattern directly coated on the transparent substrate is disposed, thereby capable of preventing the phenomenon of an undesirable photoresist film residue being left upon a silicon substrate using a Levenson-type phase shift mask, and to provide a method for fabricating the phase shift mask.

In accordance with one aspect, the present invention provides a phase shift mask comprising: a transparent substrate; a plurality of uniformly spaced photoshield film patterns formed on the transparent substrate, the photoshield film patterns being classified into groups comprising a pair of photoshield film patterns; a phase shift film pattern formed on the transparent substrate such that it is disposed between the patterns of each photo shield film pattern group; and a groove formed by etching a portion of the transparent substrate on which an edge portion of each phase shift film pattern directly coated on the transparent substrate is disposed.

In accordance with another aspect, the present invention provides a method for fabricating a phase shift mask, comprising the steps of: forming a plurality of uniformly spaced photoshield film patterns on a transparent substrate, the photoshield film patterns being classified into groups comprising a pair of photoshield film patterns; forming a phase shift film pattern on the transparent substrate such that it is disposed between the patterns of each photoshield film pattern group; forming a negative photoresist film pattern over the entire exposed upper surface of the resulting structure obtained after the formation of the phase shift film pattern; exposing the photoresist film to a light at a lower surface of the transparent substrate; removing portions of the photoresist film not exposed to the light by use of a development process, thereby forming a photoresist film pattern; forming a groove by using an exposed portion of the transparent substrate where an edge portion of the phase shift film pattern was etched; and removing the photoresist film pattern, Since grooves are provided on portions of the transparent substrate on which the edge portions of the phase shift film patterns directly coated on the transparent substrate are disposed, respectively, it is possible to prevent the intensity of light transmitting the penetrating portions of the transparent substrate from being zero and thereby preventing an undesirable photoresist film residue from being left on a silicon substrating.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENTS

Figure 1A:
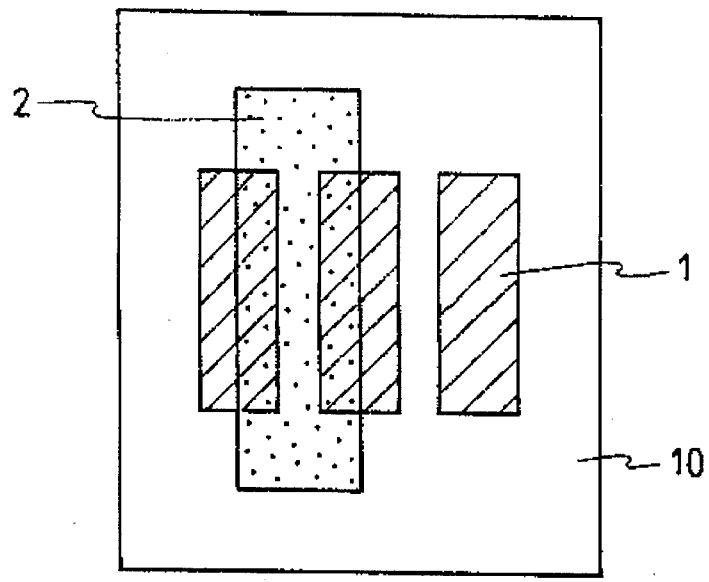
FIG. 1A is a plan view of the conventional Levenson-type phase shift mask.
Figure 1B:
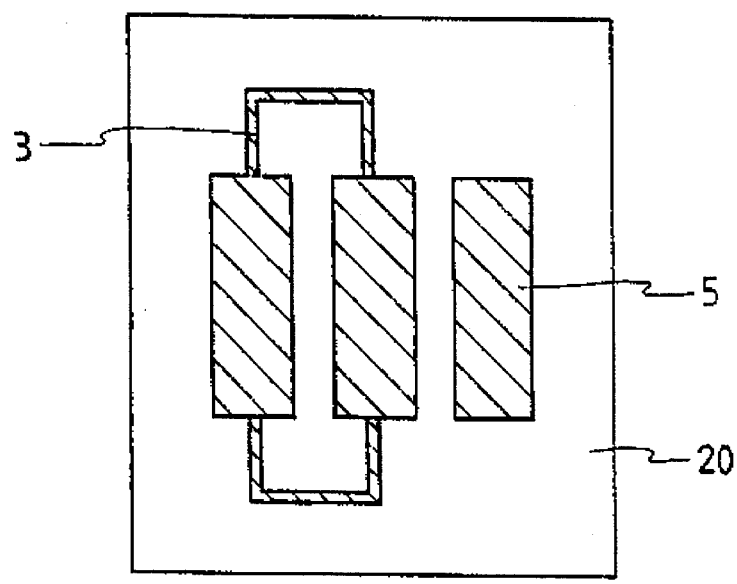
FIG. 1B is a plan view of positive photoresist film patterns formed on a wafer by use of the phase shift mask shown in FIG. 1A, showing a photoresist film residue left at edge portions of the phase shift film patterns.
Figure 2:
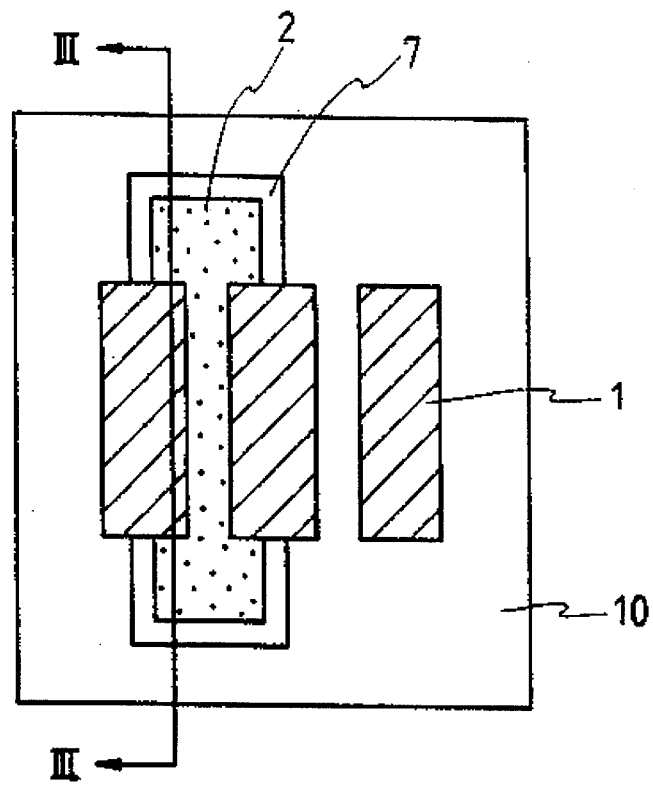
FIG. 2 is a plan view of a phase shift mask of the Levenson-type fabricated in accordance with the present invention.

FIG. 2 is a plan view of a phase shift mask of the Levenson type fabricated in accordance with the present invention. In FIG. 2, elements corresponding to those in FIG. 1A are denoted by the same reference numerals. As shown in FIG. 2, the phase shift mask includes a transparent substrate 10 such as a quartz substrate and a plurality of uniformly spaced photo-shield film patterns 1 such as chromium patterns formed on the transparent substrate 10. The photo shield film patterns 1 are classified into groups comprising a pair of photo shield film patterns 1. A phase shift film pattern 2 is formed on the transparent substrate 10 such that it is disposed between the patterns of each photoshield film pattern group. The phase shift mask also includes a groove 7 formed by etching to a predetermined depth a portion of the transparent substrate 10 on which an edge portion of each phase shift film pattern 1 directly coated on the transparent substrate 10 is disposed.

Figure 3:
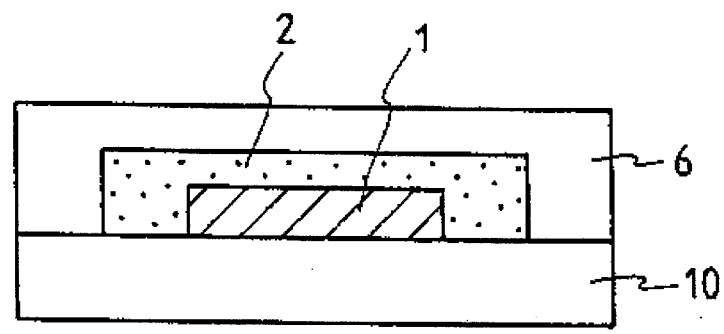
FIGS. 3 to 5 are sectional views respectively illustrating a method for fabricating the Levenson-type phase shift mask of FIG. 2 in accordance with the present invention.
Figure 4:
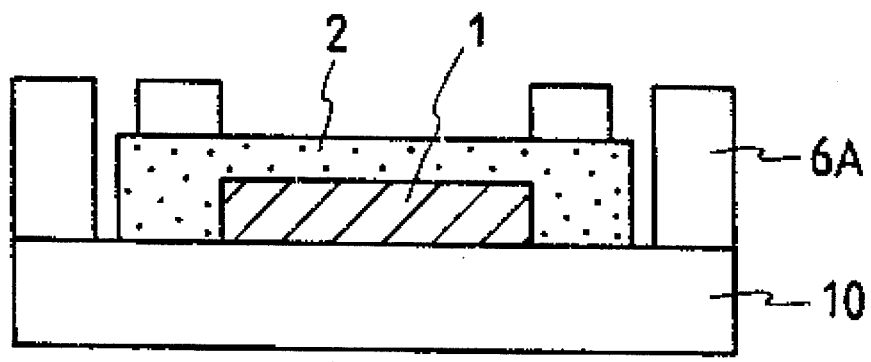
Figure 5:
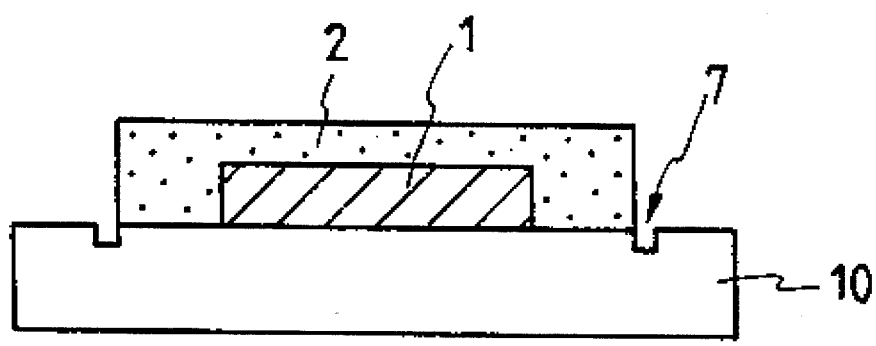

FIGS. 3 to 5 are sectional views respectively taken along the line III–III of FIG. 2 and illustrating a method for fabricating the Levenson-type phase shift mask in accordance with the present invention.

In accordance with the method of the present invention, first the photo-shield film patterns 1 are formed on the transparent substrate 10, as shown in FIG. 3. On the resulting structure, phase shift film patterns 2 are formed. Thereafter, a negative photoresist film 6 is coated over the entire exposed surface of the resulting structure.

Subsequently, the resulting structure is exposed to a light the lower surface of the transparent substrate 10 so that the photoresist film 6 is exposed to light beams respectively pentrating each photoshield film pattern 1 and each phase shift film pattern 2. The structure is then subjected to development. During development, portions of the photoresist film 6 exposed to no light are removed, thereby forming a photoresist film pattern 6A, as shown in FIG. 4. The photoresist film 6 is not exposed to any light at its portions disposed over the photo shield film patterns 1. Also, the photoresist film 6 is not exposed to any light at its boundary portions being in contact with edges of the phase shift film patterns 2 because the intensity of light penetrating the edges of phase shift film patterns 2 becomes zero.

Using the photoresist film pattern 6A as a mask, exposed portions of the transparent substrate 10 are then etched to a predetermined depth, thereby forming grooves 7, as shown in FIG. 5. As the transparent substrate 10 has the portions etched to the predetermined depth, the phase of light transmitted through the transparent substrate 10 is shifted to a predetermined degree by virtue of the difference of thickness of the transparent substrate 10. As a result, light transmitted through the boundary portions of the photoresist film pattern 6A coming in contact with the edges of phase shift film patterns 2 exhibits a predetermined intensity other than zero.

The grooves 7 have a predetermined depth fez generating a predetermined phase shift of 45°, 90°, 135°, 225°, 270° or 305°.

As apparent from the above description, the present invention provides a phase shift mask capable of avoiding a photoresist film residue being left on an undesired region after an exposure of a positive type photoresist film using a phase shift mask of the Levenson-type. Accordingly, it is possible to improve the yield in the fabrication of semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A phase shift mask comprising:

a transparent substrate;

a plurality of uniformly spaced photoshield film patterns formed on the transparent substrate;

a phase shift film pattern formed on portions of adjacent photoshield film patterns and on the transparent substrate including a portion of the transparent substrate between the adjacent photoshield film patterns; and grooves etched in portions of the transparent substrate where edges of the phase shift film pattern are disposed directly on the transparent substrate.

2. A phase shift mask in accordance with claim 1, wherein the grooves have a predetermined depth for generating a predetermined phase shift of 45°, 90°, 135°, 225°, 270° or 305° in a light incident at the groove.

3. A method for fabricating a phase shift mask, comprising the steps of:

forming a plurality of uniformly spaced photoshield film patterns on a first surface of a transparent substrate;

forming a phase shift film pattern on portions of adjacent photoshield film patterns and on portions of the first surface of the transparent substrate including a portion disposed between the adjacent photoshield film patterns;

forming a negative photoresist film over the entire exposed upper surface of the resulting structure obtained after the formation of the phase shift film pattern;

exposing the photoresist film to light at a second surface of the transparent substrate opposing the first surface;

removing portions of the photoresist film not exposed to light using a development process to form a photoresist film pattern, the photoresist film pattern exposing portions of the first surface of the transparent substrate adjacent to edges of the phase shift film pattern which are disposed directly on the first surface of the transparent substrate;

etching the exposed portions of the transparent substrate adjacent to the edges of the phase shift film pattern to form grooves in the first surface of the transparent substrate; and removing the photoresist film pattern.

4. A method in accordance with claim 3, wherein the grooves have a predetermined depth for generating a predetermined phase shift of 45°, 90°, 135°, 225°, 270° or 305° at a light transmitting the groove.

\* \* \* \* \*